United States Patent
Tokuda

(10) Patent No.: US 6,541,968 B1
(45) Date of Patent: Apr. 1, 2003

(54) MAGNETIC SENSOR COMPRISING LAMINATED SHEETS HAVING MAGNETIC BODY SURROUNDED BY COIL PATTERN

(75) Inventor: Hiromichi Tokuda, Takefu (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/564,526

(22) Filed: May 4, 2000

(30) Foreign Application Priority Data

May 7, 1999 (JP) .......................................... 11-127821

(51) Int. Cl.$^7$ ............................................. G01R 33/02
(52) U.S. Cl. ...................... 324/258; 324/260; 336/200; 336/233
(58) Field of Search ........................ 336/200–211, 221, 336/232, 233–234; 324/258, 260, 262, 244, 239

(56) References Cited

U.S. PATENT DOCUMENTS

| | | | | |
|---|---|---|---|---|
| 5,552,756 A | * | 9/1996 | Ushiro | 336/200 |
| 5,655,287 A | * | 8/1997 | Ushiro | 29/412 |
| 6,255,933 B1 | * | 7/2001 | Iwao | 336/200 |

* cited by examiner

Primary Examiner—Jay Patidar
(74) Attorney, Agent, or Firm—Dickstein, Shapiro, Morin & Oshinsky, LLP.

(57) ABSTRACT

It is an object of the present invention to provide a magnetic sensor which is suitable to be manufactured in a large amount, has a high sensitivity, and is easy to handle. A first outer layer section A is formed by laminating a plurality of magnetic sheets one upon another. A coil section is formed by laminating a plurality of coil-patterned sheets one upon another. A second outer layer section is formed by laminating a plurality of magnetic sheets one upon another. Each of the sheets forming the coil section B has its central portion formed by an elliptical magnetic body and its surrounding portion formed by a non-magnetic body on which a coil pattern is formed by a film located on the non-magnetic body.

6 Claims, 2 Drawing Sheets

MAGNETIC SENSOR COMPRISING LAMINATED SHEETS HAVING MAGNETIC BODY SURROUNDED BY COIL PATTERN

BACKGROUND OF THE INVENTION

1. Field of the Invention

The present invention relates to a magnetic sensor, particularly to a magnetic sensor for detecting a change of an external magnetic field in terms of a change in an electric current value.

2. Description of the Related Art

Conventionally, there has been known a magnetic sensor which is formed by using a chip coil as shown in FIG. 4. Such kind of a magnetic sensor comprises a ferrite core section 1 including a lower flange member 2, an upper flange member 3 and a trunk member 4, and a coil 5 wound around the trunk member 4, in a manner such that it is allowed to detect an electric current flowing through the coil 5 by detecting a change in a magnetic flux $\phi$ passing through the core section 1. For example, when a magnetic flux $\phi$ is generated by a permanent magnet attached on a rotating body, the magnetic sensor can be used to provide a function as a sensor for detecting rotation.

However, since the magnetic sensor shown in FIG. 4 has a structure formed by winding a core wire around the core section 1, there has been a problem that its productivity is low and its sensitivity is not satisfactory. Indeed, it will be favourable if the upper flange member 3 is made to have a large area, since such a flange member is used to collect the magnetic flux $\phi$. On the other hand, there is a limitation on the size of the flange member. This is because in a general manufacturing process, since the lower flange member 2 is chucked and an automatic wire winding machine is used to wind the coil 5 around the trunk, it can not be avoided that the upper flange member 3 is made to have a small size. Further, since the lower flange member 2 and the upper flange member 3 are very likely to get chipped or cracked, a special care should be taken when handling these flange members.

SUMMARY OF THE INVENTION

It is an object of the present invention to provide a laminated type magnetic sensor which is suitable to be manufactured in a large amount, has a high sensitivity, and is easy to handle.

In order to achieve the above object, a magnetic sensor of the present invention comprises: a coil section formed by laminating together a plurality of non-magnetic sheets each having a coil pattern formed thereon and having a magnetic body disposed on the center of the coil pattern; a first outer layer section and a second outer layer section, each being formed by laminating together magnetic sheets, the first and second outer layer sections are laminated on obverse and reverse surfaces of the coil section, respectively; electrodes electrically connected with end portions of the coil patterns.

Thus, the magnetic sensor of the present invention has a laminated structure including the coil section, the first outer layer section and the second outer layer section both disposed to cover up the front and back surfaces of the coil section, and is allowed to be manufactured in mass production process by using the same process for manufacturing a conventional electronic component such as a conventional laminated type inductor and a conventional capacitor. In fact, the magnetic sensor of the present invention is easy to handle. The first or second outer layer section is formed to provide a function of collecting an external magnetic flux. Since such an outer layer section is set to have the same area as that of the coil section and thus has a relatively large area, it is sure to effectively collect the external magnetic flux and allow it to penetrate through the magnetic body located in the center of each coil pattern. Accordingly, the magnetic sensor of the present invention is sure to obtain an increased sensitivity.

Further, in the magnetic sensor of the present invention, each of the sheets forming the coil section has its substantially central portion formed by a magnetic body and its surrounding portion formed by a non-magnetic body, further includes a coil pattern formed on the non-magnetic body. Therefore, the magnetic sensor has a good magnetic efficiency and its coil section can be easily handled by treating the sheets one by one.

DESCRIPTION OF THE PREFERRED EMBODIMENTS

An embodiment of a magnetic sensor made according to the present invention will be described in the following with reference to the accompanying drawings.

Figure 1:
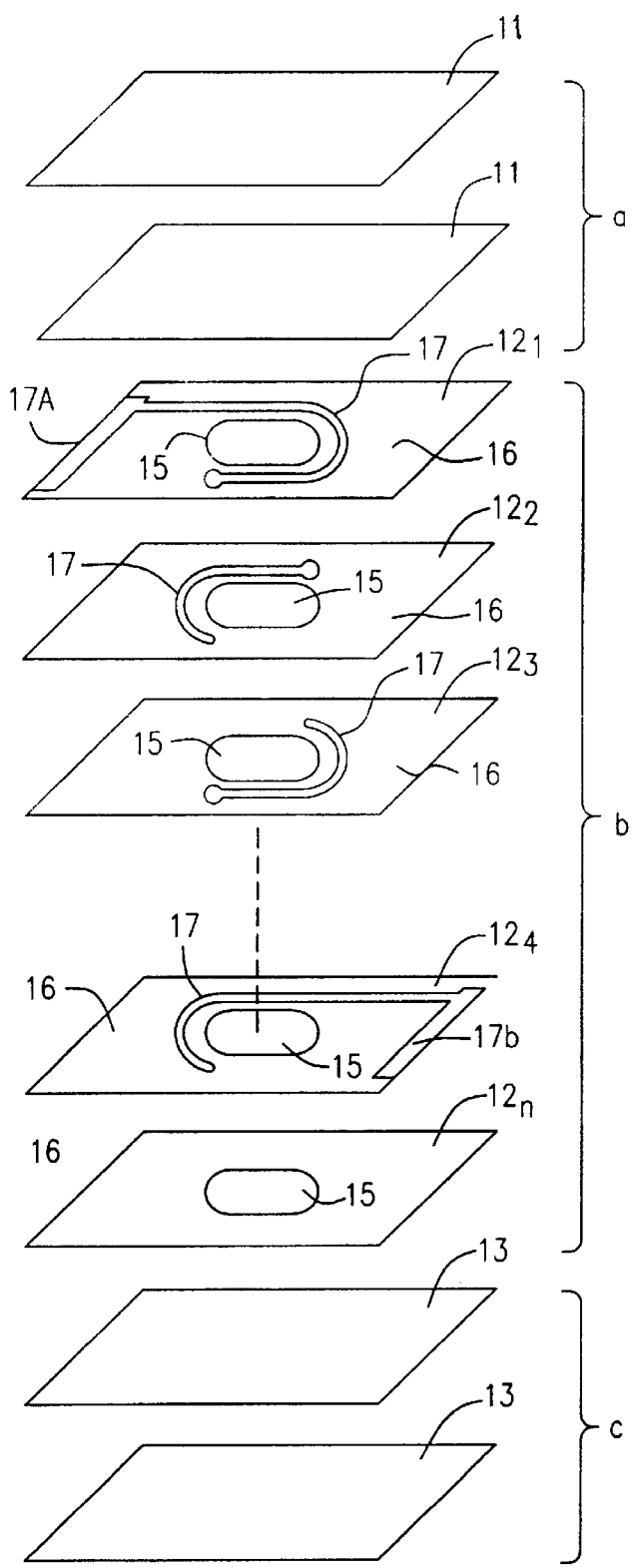
FIG. 1 is an exploded perspective view schematically indicating a magnetic sensor made according to one embodiment of the present invention.
Figure 2:
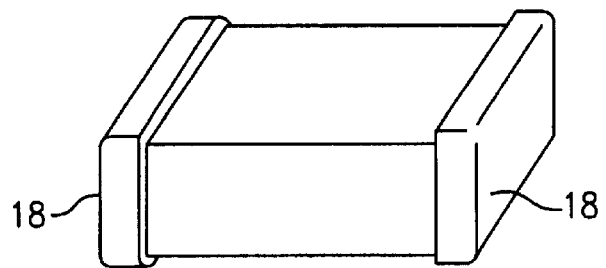
FIG. 2 is a perspective view schematically indicating the outer appearance of the above magnetic sensor.
Figure 3:
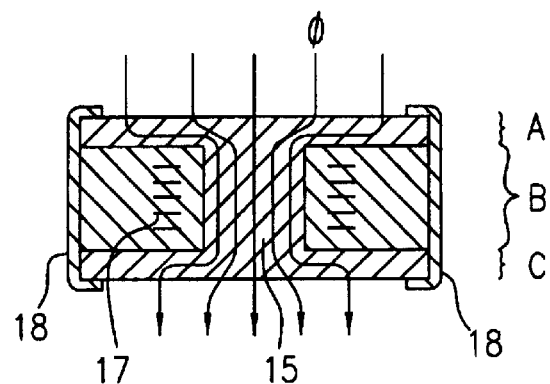
FIG. 3 is a central cross sectional view schematically indicating the above magnetic sensor.
Figure 4:
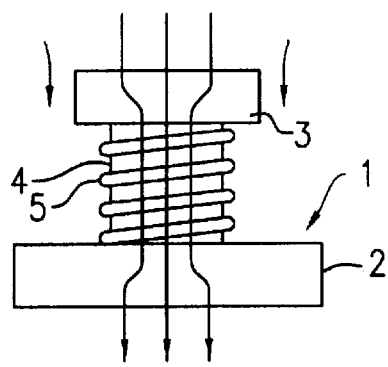
FIG. 4 is a front view schematically indicating a conventional magnetic sensor.

FIG. 1 is an exploded perspective view showing a plurality of sheet like materials forming a laminated type magnetic sensor according to one embodiment of the present invention. FIG. 2 is a perspective view showing the external appearance of the magnetic sensor. FIG. 3 is a cross sectional view showing how the magnetic flux can penetrate through the magnetic sensor.

In detail, the magnetic sensor comprises a first outer layer section A formed by laminating one upon another a plurality of magnetic sheets 11, a coil section B formed by laminating one upon another a plurality of coil-patterned sheets 12 ($12_1$, $12_2$, $12_3$, ... $12_n$), and a second outer layer section C formed by laminating one upon another a plurality of magnetic sheets 13.

Each of the sheets 12 forming the coil section B has an elliptic magnetic body 15 disposed in the center thereof, and a non-magnetic portion 16 surrounding the magnetic body. On each of the sheets $12_1$, to $12_4$ there is formed a coil pattern 17 surrounding the magnetic body 15. These coil patterns 17 are electrically connected with one another at their ends through via holes (not shown) formed on these sheets by laminating the sheets 12 one upon another, thereby forming one coil (inductor). The coil patterns 17 on the uppermost and lowermost sheets are respectively led out to end portions of the sheets 12, thereby forming connection terminals 17a and 17b.

As materials necessary to form the coil section, it is allowed to use some known substances. For example, it is allowed to use a ferrite material to form the magnetic body and to use a glass or a ceramic or other dielectric material to form the non-magnetic body. The coil patterns may be formed by a carbon paste or various other electrically conductive materials, by forming a thick film through an application of a paste, or by forming a thin film through a vapor deposition of molecules.

The sheets 11, 12, and 13 shown in FIG. 1 may be used to form a unit magnetic sensor in a manner as illustrated. However, a practical process may be that several mother sheets are prepared each having a relatively large size and these large size sheets are then laminated one upon another so as to form a laminated body. After that, the laminated body is sintered to form a sintered body which is then cut one by one unit so as to form a plurality of unit magnetic sensors. Further, between two sheets $12_3$ and $12_4$ which constitutes the coil section B, there may be disposed a plurality of patterned sheets (not shown), thereby forming a coil having predetermined turns. Each laminated body cut out as one unit, is provided on opposite end portions thereof with two external electrodes 18, 18 as shown in FIG. 2. These external electrodes 18, 18 are electrically connected to the connection terminals 17a and 17b of the above coil patterns 17.

In the magnetic sensor having the above structure, as shown in FIG. 3, an external magnetic flux $\phi$ is allowed to flow into the sensor through the first outer layer section A made of a magnetic material, and then penetrate through the magnetic body 15 located in the center of the coil section B. According to a change in the magnetic flux $\phi$ passing through the magnetic body 15, electric currents flowing through the coil patterns change. Thus the magnetic flux $\phi$ is detected in terms of a value of the electric currents flowing between the two external electrodes 18, 18.

In the present embodiment, the first outer layer section A is used to cover up the entire area of the laminated body, and has an area which is larger than that of any of the coil patterns 17. In this way, the magnetic flux $\phi$ existing around the coil patterns 17 will be effectively collected by the first outer layer section A, thereby ensuring a good sensitivity for the magnetic sensor. Further, since the magnetic sensor has a laminated structure formed by the sheets 11, 12 and 13, it is allowed to be manufactured in mass production process with the use of the same process for manufacturing a similar laminated type electronic component such as a chip inductor. Thus, since the magnetic sensor is a chip component, it is easy to handle.

However, the magnetic sensor of the present invention should not be limited by the above embodiment described in the above, and it is possible to make various modifications within the scope of the spirit of the invention. For example, it is allowed to make a cavity which is corresponding to the magnetic body 15 of the coil section B, and then fill the cavity with a magnetic material after the sheets 12 are laminated one upon another. Alternatively, it is possible to form a magnetic film on the central portion of each non-magnetic sheet. In addition, the coil patterns may be made into various desired shapes.

As may be clearly understood from the above description, according to the present invention, the first and second outer layer sections, which are made of a magnetic material to cover up both the front and back surfaces of the coil section, each have the same area as that of the coil section, making it possible to efficiently collect the external magnetic flux, thereby effectively increasing a sensitivity of the magnetic sensor. Further, since the magnetic sensor has been formed into a laminated type, such kind of the sensor may be manufactured in an industrial level and is easy to handle.

What is claimed is:

1. A magnetic sensor, comprising:

a coil section formed by laminating a plurality of non-magnetic sheets, each of the non-magnetic sheets having a respective coil pattern and a respective magnetic body section disposed inside the respective coil pattern before the non-magnetic sheets are laminated together, the coil patterns being coupled together to form a coil, the magnetic body sections being coupled together to form a central magnetic body located within the coil;

first and second outer layer sections, each of said outer layer sections being a lamination of a plurality of magnetic sheets, the first and second outer layer sections being laminated to the top and bottom of the coil section, respectively, so that they are coupled to opposite ends of the central magnetic body; and a plurality of electrodes electrically connected with first and second end portions of the coil, respectively.

2. The magnetic sensor of claim 1, wherein the electrodes comprise first and second electrodes which are electrically connected to the first and second end portions of the coil, respectively.

3. The magnetic sensor of claim 1, wherein the magnetic body section of each of the non-magnetic sheets of the coil section is located in the center of its non-magnetic sheet.

4. The magnetic sensor of claim 3, wherein the coil pattern of each of the non-magnetic sheets of the coil section at least partially surrounds its respective magnetic body section.

5. The magnetic sensor of claim 3, where each of the magnetic body sections is an elliptical magnetic body.

6. The magnetic sensor of claim 1, wherein the plurality of electrodes comprise only first and second electrodes, the first and second electrodes being disposed on opposite side surfaces of the lamination of non-magnetic sheets.

* * * * *